(12) United States Patent
Kissing et al.

(10) Patent No.: US 8,324,028 B2
(45) Date of Patent: Dec. 4, 2012

(54) ASSEMBLY COMPRISING A SUPPORT ELEMENT AND A CHIP, SUPPORT ELEMENT, METHOD FOR SHIELDING, AND METHOD FOR PROTECTING

(75) Inventors: Jens Kissing, Boenen (DE); Dietolf Seippel, Bottrop (DE)

(73) Assignee: Infineon Technologies AG, Munich (DE)

( * ) Notice: Subject to any disclaimer, the term of this patent is extended or adjusted under 35 U.S.C. 154(b) by 827 days.

(21) Appl. No.: 11/607,218

(22) Filed: Dec. 1, 2006

(65) Prior Publication Data
US 2008/0129394 A1    Jun. 5, 2008

(51) Int. Cl.
*H01L 21/44* (2006.01)
(52) U.S. Cl. ............... 438/118; 257/724; 257/E21.511; 257/E23.023

(58) Field of Classification Search .................. 257/684, 257/686, 666, 778, E21.511, E23.023, 724, 257/678; 438/118, 126–129, 121
See application file for complete search history.

(56) References Cited

U.S. PATENT DOCUMENTS
| | | |
|---|---|---|
| 6,137,161 A | 10/2000 | Gilliland et al. |
| 6,618,267 B1 | 9/2003 | Dalal et al. |
| 2005/0212084 A1 | 9/2005 | Grange |

FOREIGN PATENT DOCUMENTS
JP     2003115578     4/2003

*Primary Examiner* — (Vikki) Hoa B Trinh
(74) *Attorney, Agent, or Firm* — Slater & Matsil, L.L.P.

(57) ABSTRACT

An assembly includes a support element and a chip having contact elements. The chip is mounted onto the support element with the contact elements facing the support element. A shield layer is on the support element for electrically or magnetically shielding a circuit element of the chip.

31 Claims, 3 Drawing Sheets

ASSEMBLY COMPRISING A SUPPORT ELEMENT AND A CHIP, SUPPORT ELEMENT, METHOD FOR SHIELDING, AND METHOD FOR PROTECTING

BACKGROUND

1. Field of the Invention

This invention relates to assemblies having a support element and/or a chip and methods for shielding and protecting the same.

2. Description of Related Art

In the technical field of electronic packaging, a variety of different packages for integrated circuits have been developed in the past. For example, surface-mount devices have been developed that have a ceramic package (or module) with solder pads that provide connection to the integrated circuit. These solder pads may be made much smaller than the area required by a pin in previous pin-grid array (PGA) packages or dual in-line (DIP) packages, resulting in a higher connection density.

Surface mount modules may be mounted on a variety of different types of circuit boards, circuit modules or other system boards. A system board designed to receive a surface mount module typically provides landing pads that align with the landing pads on the module. Solder balls or solder bumps may be formed on either the module landing pads, the system board landing pads, or both. The surface mount module is then placed on the system board and the entire assembly is heated until the solder balls flow and form a good electrical connection between landing pads. The array of solder balls thus serve as an interconnect mechanism between the landing pads on the module and the landing pads on the system board.

As an example of surface mount modules, ball-grid array (BGA) and column-grid array (CGA) chip carrier modules have used arrays of solder balls or column (sometimes referred to as cylinders) as input and output connection. In this application, the term "solder balls" will be used generically to refer to the balls, bumps, columns, cylinders or other suitable connections used as surface mount module interconnects. With a dense array of solder balls covering one side of the module, BGA and CGA modules can provide a large number of input and output connections to the chip in the module without using excessive space.

In many applications the BGA or CGA technology is used in connection with the flip-chip concept. When the chips or modules are connected to the system board, the chips are flipped over and placed so that the array of solder balls are aligned with the corresponding array of landing pads on the system board. The chip and system board are then heated, allowing the solder paste to melt and flow for establishing the physical and electrical connection between the chip and the system board. In this application, the term "flip-chip" will be used generically to refer to a chip having contact elements, the chip being mounted onto a support element with contact elements facing the support element.

DETAILED DESCRIPTION

Figure 1:
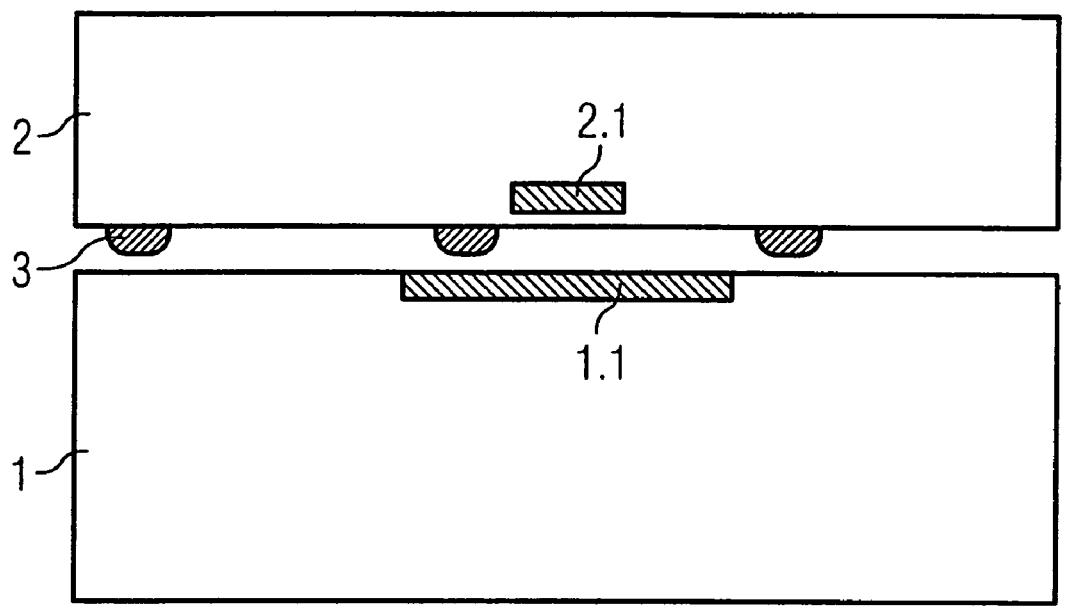
FIG. 1 is a schematic drawing for illustrating an embodiment of an assembly according to the present invention.

The aspects and embodiments of the invention are described with reference to the drawings, wherein like reference numerals are generally utilized to refer to like elements throughout. In the following description for purposes of explanation numerous specific details are set forth in order to provide a thorough understanding of one or more aspects of embodiments of the invention. It may be evident, however, to one skilled in the art that one or more aspects of the embodiments of the invention may be practiced with a lesser degree of the specific details. In other instances, known structures and devices are shown in block diagram form in order to facilitate describing one or more aspects of the embodiments of the invention. The following description is therefore not to be taken in a limiting sense, and the scope of the invention is defined by the appended claims.

An assembly comprising a support element and a chip is described below. The chip has contact elements and is mounted onto the support element with the contact elements facing the support element. Chips may be any type of integrated circuits comprising any configuration and number of circuit elements. The chip can comprise one or more metallization layers and the circuit elements can be arranged in one or several of the metallization layers of the chip. Support elements may be any type of support elements which are able to support the chip with the contact elements facing the support element. In particular, the support element may be a so-called interposer arranged between the chip and a printed-circuit board (PCB), for example. The support element may also be any other substrate, e.g. ceramic substrate, glass substrate, polymer substrate or PCB. The contact elements may be any type of contact elements which can be provided on the chip. In particular, the contact elements may be solder balls or solder bumps arranged in the form of an array known as ball-grid array (BGA), for example.

For the reasons set out above, flip-chip BGA packages have become an interesting alternative to conventional VQFN (very thin quad flat non-leaded) packages also for RF transceiver chips. RF transceiver chips comprise high performance RF circuits in which voltage controlled oscillators (VCOs) play an essential role. The coils and capacitors of these VCOs are normally realized in the upper metallization layer as it is the thickest one and has the lowest resistance. When a chip is flip-mounted on a substrate, the upper metallization layer of the chip is closely spaced to the wiring present in the substrate. Because of this short distance between the coils and capacitors in the upper metallization layer of the chip on the other hand and the substrate wiring on the other hand, capacitive as well as inductive coupling into the coils and capacitors and thus into the RF circuit can occur. Harmonics of the signals transmitted by the substrate wiring can couple into the RF circuit and generate spurious side-bands in the output spectrum of the VCO signal. Also a supply line with changing current loads can couple into a VCO and lead to phase errors in the output signal of the VCO.

Referring to FIG. 1, there is shown a schematic drawing for illustrating an embodiment of an assembly according to the present invention. The assembly comprises a support element 1 in the form of an interposer 1. The interposer 1 is supposed to be mounted on a printed-circuit board (PCB) (not shown). The assembly also comprises a chip 2 having contact elements 3 wherein the contact elements 3 face the interposer 1. The chip 2 is mounted on the interposer 1 by use of the contact elements 3. The chip 2 comprises at least one circuit element 2.1. This circuit element 2.1 may be arranged in one of a plurality of metallization layers of the chip 2, in particular in the uppermost metallization layer. The interposer 1 comprises a shield layer 1.1 for shielding the circuit element 2.1 of the chip 2. The shield layer 1.1 is preferably connected with a potential terminal of the chip providing a fixed electrical potential, e.g. with anyone of the supply voltages of the chip or a ground potential terminal by use of suitable connecting elements (not shown). The shield layer 1.1 may be arranged in an uppermost metallization layer of the interposer 1. The shield layer 1.1 may have lateral dimensions larger than the lateral dimensions of the circuit element to be shielded by the shield layer 1.1.

Figure 2:
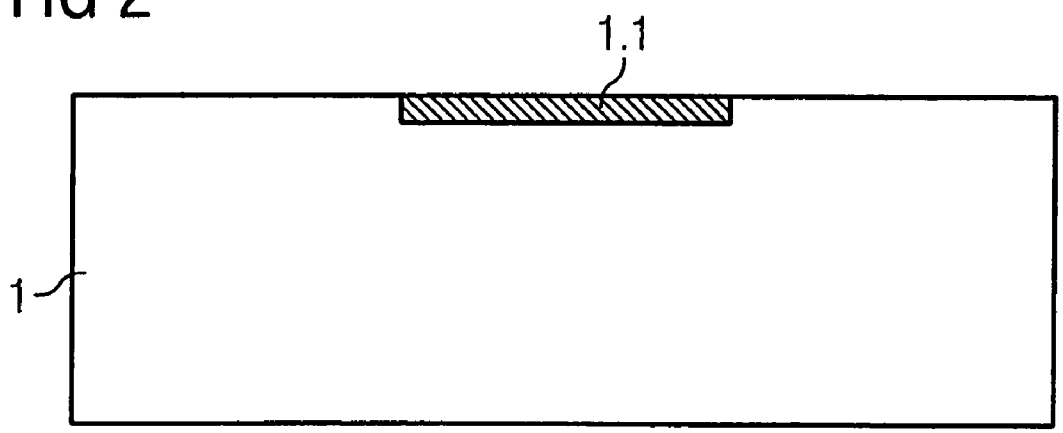
FIG. 2 is a schematic drawing for illustrating an embodiment of a support element according to the present invention.

Referring to FIG. 2, there is shown a schematic drawing for illustrating an embodiment of a support element according to the present invention. The support element 1 may be an interposer as described above in connection with FIG. 1. The interposer 1 comprises a shield layer 1.1 for shielding a circuit element of a chip (not shown) to be connected with the interposer 1. The shield layer 1.1 may be arranged in an uppermost metallization layer of the interposer 1. The shield layer 1.1 may have lateral dimensions larger than the lateral dimensions of the circuit element to be shielded by the shield layer 1.1.

The circuit element 2.1 can be any circuit element of the chip 2. In particular, the circuit element 2.1 can be a circuit element which is sensitive for coupling external signals into it. For example, the circuit element 2.1 may be a coil which, for example, may be part of a voltage controlled oscillator (VCO). The circuit element 2.1 may also be a capacitor, for example, which may be part of the VCO, for example. The shield layer 1.1 may be any shield layer being able to electrically or mechanically shield the circuit element 2.1 of the chip 2 or any shield layer able to protect the circuit element 2.1 of the chip 2 from capacitive or inductive coupling. In particular, the shield layer 1.1 may be an electrically conductive layer, e.g. a metallic layer.

Figure 3:
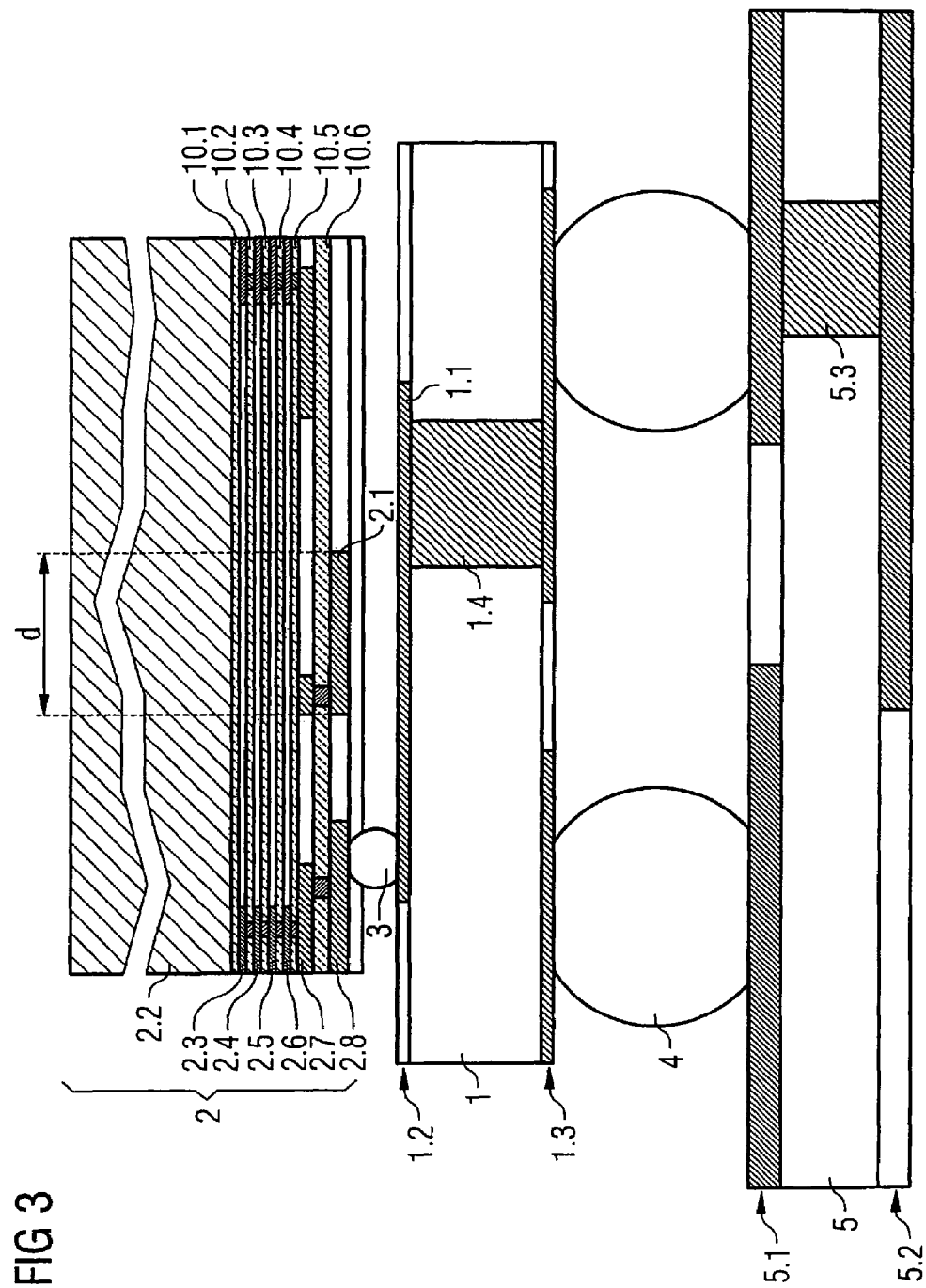
FIG. 3 is a schematic drawing for illustrating an embodiment of an assembly according to the present invention.

Referring to FIG. 3, there is shown a schematic drawing for illustrating a further embodiment of an assembly according to the present invention. A chip 2 is flip-chip mounted on an interposer 1 by use of solder balls 3 or solder bumps 3 as contact elements facing the interposer 1. The chip 2 comprises a substrate 2.2 and a plurality of metallization layers 2.3 to 2.8 deposited on the substrate 2.2. While the metallization layers 2.3 to 2.8 are insulated from each other by thin insulation layers 10.1 to 10.6, the metallization layers 2.3 to 2.8 are interconnected by use of via connections wherein each via connection connects two neighboring metallization layers. The production of the metallization layers, the insulation layers and the via connections on the substrate 2.2 is carried out by standard thin film technology processes that are generally well-known in the field of microelectronic circuit manufacturing. The uppermost metallization layer 2.8 is the thickest metallization layer and therefore has the lowest electrical resistivity. In this uppermost metallization layer 2.8 there is provided a coil 2.1 which is part of a voltage controlled oscillator (VCO).

The interposer 1 comprises a first metallization layer 1.2 which is arranged at the surface of the interposer 1. In the first metallization layer 1.2 there is provided a shield layer 1.1 for electrically or magnetically shielding the coil 2.1 of the chip. The coil 2.1 has, for example, a lateral dimension d of about 0.2 to 0.3 mm. The lateral dimension of the shield layer 1.1 is, for example, in the range of 0.5 to 1.0 mm. The lateral dimension of the shield layer 1.1 is significantly larger than the lateral dimension d of the coil 2.1 in order to properly shield or protect the coil 2.1 from capacitive or inductive coupling which may arise from any electrical signals, stemming, for example, from the metallization layer 1.2 or any other metallization layer below the metallization layer 1.2.

The interposer 1 also comprises a second metallization layer 1.3 which is arranged at a surface opposite to the uppermost surface of the interposer 1. The first and second metallization layers 1.2 and 1.3 are interconnected by a via connection 1.4.

The interposer 1 is connected to a printed circuit board (PCB) 5 by use of solder balls 4 or solder bumps 4. The PCB 5 comprises a first metallization layer 5.1 and a second metallization layer 5.2 wherein the first and second metallization layers 5.1 and 5.2 are interconnected by a via connection 5.3. The shield layer 1.1 may be connected to the VDD or VSS potential terminal of the assembly, e.g. by using the above described connection elements.

While still referring to FIG. 3, the coil 2.1 is located within the uppermost metallization layer 2.8 of the chip 2, it should be obvious that the coil 2.1 may also be located in any one or a combination of the other metallization layers 2.2 to 2.8 of the chip 2 without deviating from the scope of the invention. Further, while the shield 1.1 in FIG. 3 is located within the first metallization layer 1.2, it may also be located within anyone or a combination of the other metallization layers 1.2 and 1.3 of the interposer 1.

Figure 4:
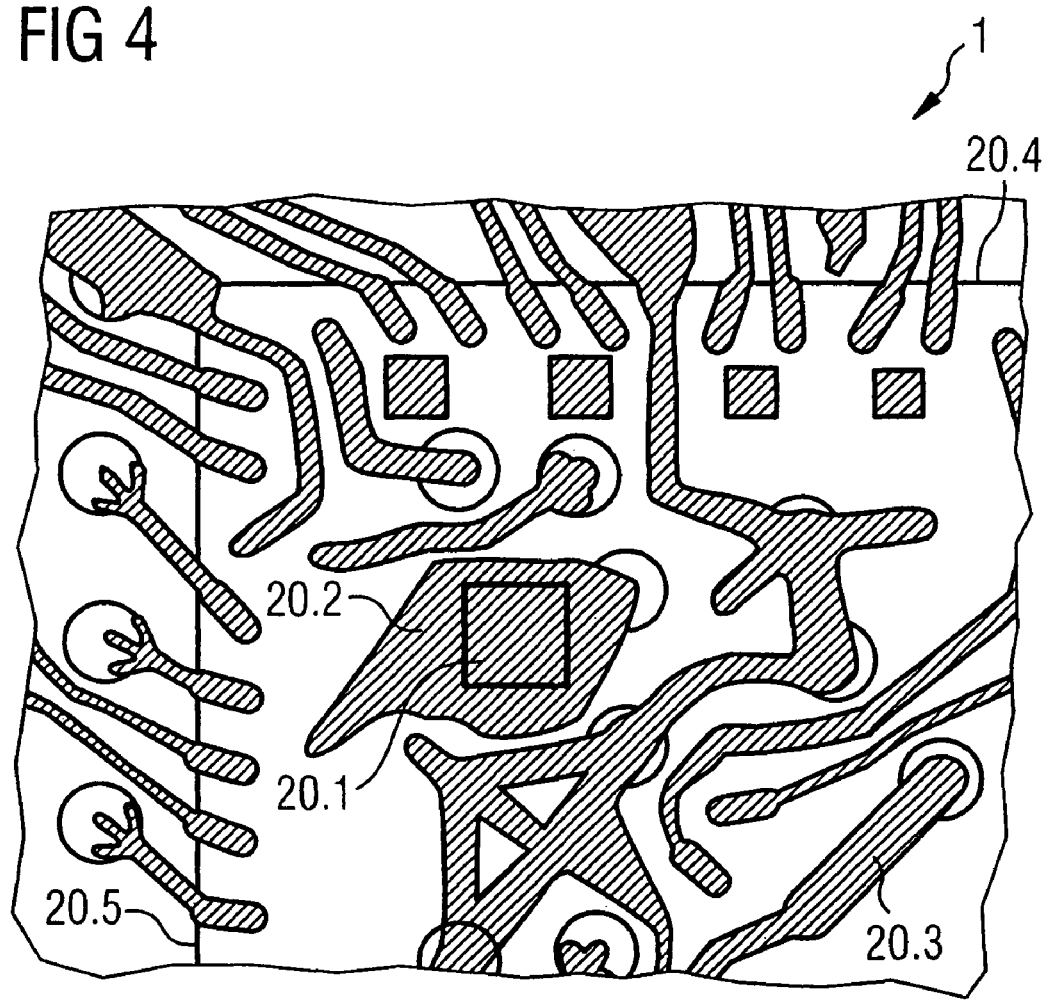
FIG. 4 is a schematic drawing for illustrating an embodiment of a support element according to the present invention.

Referring to FIG. 4, there is shown a schematic drawing for illustrating a further embodiment of a support element. The support element may be an interposer 1. In the drawing of FIG. 4a section of the interposer 1 is shown wherein the upper and left straight border lines 20.4 and 20.5 mark the upper left corner of the area where the chip is to be placed. There is shown the shield layer 20.2 which is arranged for electrically or magnetically shielding a circuit element, e.g. the VCO area 20.1, of a chip to be connected with the interposer 1. There are also shown electrically conductive areas 20.3 of the first metallization layer 1.2 (see FIG. 3) connected with solder balls 4 for connecting the interposer 1 with a PCB 5, for example.

As a person skilled in the art will readily appreciate, the above description is meant as an illustration of implementation of the principles of this invention. This description is not intended to limit the scope or application of this invention in that the invention is susceptible to modification, variation and change, without departing from the spirit of this invention, as defined in the following claims.

The invention claimed is:
1. An assembly comprising:
a chip having contact elements and a circuit element, wherein the circuit element comprises a capacitor or an inductor;
a support element comprising a shield layer configured to electrically or magnetically shield the circuit element of the chip, wherein the chip is mounted on the support element such that at least one of the contact elements is electrically connected to the shield layer, the at least one of the contact elements being directly adjacent to and in direct mechanical contact with the shield layer; and
a printed circuit board, wherein the support element is mounted on the printed circuit board.
2. An assembly comprising:
a support element;
a chip comprising circuit elements, the chip also comprising contact elements, wherein at least one of the circuit elements comprises a capacitor or an inductor;
an electrically conductive layer on the support element, the electrically conductive layer comprising a shield config- ured to protect the at least one of the circuit elements of the chip from capacitive or inductive coupling;
at least one of the contact elements being electrically connected to the electrically conductive layer, the at least one of the contact elements being directly adjacent to and in direct mechanical contact with the shield; and
a printed circuit board, the support element being mounted to the printed circuit board.

3. A method for electrically or magnetically shielding a circuit element of a chip, the method comprising:
forming a shield layer on a support element;
mounting the chip on the support element, the chip comprising contact elements, wherein the circuit element comprises a capacitor or an inductor;
electrically connecting at least one of the contact elements to the shield layer, the at least one of the contact elements being directly adjacent to and in direct mechanical contact with the shield layer; and
mounting the support element on a printed circuit board.

4. A method for protecting a circuit element of a chip from capacitive or inductive coupling, the method comprising:
forming an electrically conductive layer directly on a top surface of a support element, the electrically conductive layer comprising a shield;
flip-chip mounting the chip on the support element, the chip comprising contact elements, wherein the circuit element comprises a capacitor or an inductor;
electrically connecting at least one of the contact elements to the electrically conductive layer, the at least one of the contact elements being directly adjacent to and in direct mechanical contact with the shield; and
mounting the support element on a printed circuit board.

5. The assembly according to claim 1, wherein the shield layer is a continuous layer arranged parallel to the circuit element, and wherein the shield layer is substantially larger than the circuit element.

6. The assembly according to claim 1, wherein the circuit element comprises a coil or a voltage controlled oscillator (VCO).

7. The assembly according to claim 6, wherein the coil or the VCO comprises a lateral dimension of about 0.2 mm to 0.3 mm, and wherein the shield layer comprises a lateral dimension of 0.5 mm to 1.0 mm.

8. The assembly according to claim 1, wherein the shield layer is a continuous metal shield.

9. The assembly according to claim 1, wherein the shield layer is connected to a fixed potential.

10. The assembly according to claim 9, wherein the fixed potential is a supply voltage of the chip or a ground potential.

11. The assembly according to claim 2, wherein the shield is a continuous metal shield arranged parallel to the at least one of the circuit elements, and wherein the shield is substantially larger than the at least one of the circuit elements.

12. The assembly according to claim 2, wherein the at least one of the circuit elements comprises a coil or a voltage controlled oscillator (VCO).

13. The assembly according to claim 12, wherein the coil or the VCO comprises a lateral dimension of about 0.2 mm to 0.3 mm, and wherein the shield comprises a lateral dimension of 0.5 mm to 1.0 mm.

14. The assembly according to claim 2, wherein the shield is connected to a fixed potential.

15. The assembly according to claim 14, wherein the fixed potential is a supply voltage of the chip or a ground potential.

16. The method according to claim 3, wherein the shield layer is arranged parallel to the circuit element, and wherein the shield layer is substantially larger than the circuit element.

17. The method according to claim 3, wherein the circuit element comprises a coil or a voltage controlled oscillator (VCO).

18. The method according to claim 17, wherein the coil or the VCO comprises a lateral dimension of about 0.2 mm to 0.3 mm, and wherein the shield layer comprises a lateral dimension of 0.5 mm to 1.0 mm.

19. The method according to claim 3, wherein the shield layer is a continuous shield.

20. The method according to claim 3, further comprising connecting the shield layer to a fixed potential.

21. The method according to claim 20, wherein the fixed potential is a supply voltage of the chip or a ground potential.

22. The method according to claim 4, wherein the shield is arranged parallel to the circuit element, and wherein the shield is substantially larger than the circuit element.

23. The method according to claim 4, wherein the circuit element comprises a coil or a voltage controlled oscillator (VCO).

24. The method according to claim 23, wherein the coil or the VCO comprises a lateral dimension of about 0.2 mm to 0.3 mm, and wherein the shield comprises a lateral dimension of 0.5 mm to 1.0 mm.

25. The method according to claim 4, wherein the shield is a continuous shield.

26. The method according to claim 4, further comprising connecting the shield to a fixed potential.

27. The method according to claim 26, wherein the fixed potential is a supply voltage of the chip or a ground potential.

28. The assembly according to claim 11, wherein the shield is arranged on a top surface of the support element, and wherein the circuit element is arranged in a top metal layer of the chip.

29. The assembly according to claim 1, wherein the shield layer is arranged on a top surface of the support element, and wherein the circuit element is arranged in a top metal layer of the chip.

30. The method according to claim 3, wherein the shield layer is a continuous metal shield, wherein the shield layer is arranged on a top surface of the support element, and wherein the circuit element is arranged in a top metal layer of the chip.

31. The method according to claim 4, wherein the shield is a continuous metal shield, and wherein the circuit element is arranged in a top metal layer of the chip.

* * * * *